(12) United States Patent
Zhang et al.

(10) Patent No.: US 8,232,568 B2
(45) Date of Patent: Jul. 31, 2012

(54) HIGH BRIGHTNESS LED UTILIZING A ROUGHENED ACTIVE LAYER AND CONFORMAL CLADDING

(75) Inventors: Ling Zhang, San Jose, CA (US); Steven D. Lester, Palo Alto, CA (US); Jeffrey C. Ramer, Sunnyvale, CA (US)

(73) Assignee: Bridgelux, Inc., Livermore, CA (US)

( * ) Notice: Subject to any disclaimer, the term of this patent is extended or adjusted under 35 U.S.C. 154(b) by 0 days.

(21) Appl. No.: 12/545,358

(22) Filed: Aug. 21, 2009

(65) Prior Publication Data
US 2010/0133562 A1 Jun. 3, 2010

(51) Int. Cl.
*H01L 33/00* (2010.01)
(52) U.S. Cl. ...... 257/94; 257/98; 257/190; 257/E51.021
(58) Field of Classification Search .............. 257/94, 257/98, 190, E51.021
See application file for complete search history.

(56) References Cited

U.S. PATENT DOCUMENTS

| 6,984,841 | B2 * | 1/2006 | Tsuda et al. | 257/12 |
|---|---|---|---|---|
| 2005/0017257 | A1 | 1/2005 | Green | 257/98 |
| 2005/0045894 | A1 * | 3/2005 | Okuyama et al. | 257/95 |
| 2006/0246612 | A1 * | 11/2006 | Emerson et al. | 438/22 |
| 2007/0259504 | A1 * | 11/2007 | Bour et al. | 438/341 |
| 2009/0272993 | A1 * | 11/2009 | Cheong | 257/94 |
| 2009/0294785 | A1 * | 12/2009 | Cok | 257/98 |

FOREIGN PATENT DOCUMENTS

| JP | 2000-174335 A | 6/2000 |
|---|---|---|
| JP | 2000-286506 A | 10/2000 |
| JP | 2003-151910 A | 5/2003 |
| KR | 10-2006-0135571 | * 12/2006 |
| KR | 10-2009-0010284 A | 1/2009 |

OTHER PUBLICATIONS

International Search Report, PCT/US201/041356, Jan. 27, 2011, all pages.
Preliminary Report on Patentability, PCT/US2010/041356 dated Mar. 1, 2012.

* cited by examiner

*Primary Examiner* — Zandra Smith
*Assistant Examiner* — Jamie C Niesz
(74) *Attorney, Agent, or Firm* — Calvin B. Ward (57) ABSTRACT

A light emitting device and method for making the same are disclosed. The device includes an active layer disposed between first and second layers. The first layer has top and bottom surfaces. The top surface includes a first material of a first conductivity type, including a plurality of pits in the substantially planar surface. The active layer overlies the top surface of the first layer and conforms to the top surface, the active layer generating light characterized by a wavelength when holes and electrons recombine therein. The second layer includes a second material of a second conductivity type, the second layer overlying the active layer and conforming to the active layer. The device can be constructed on a substrate having a lattice constant sufficiently different from that of the first material to give rise to dislocations in the first layer that are used to form the pits.

8 Claims, 5 Drawing Sheets

HIGH BRIGHTNESS LED UTILIZING A ROUGHENED ACTIVE LAYER AND CONFORMAL CLADDING

BACKGROUND OF THE INVENTION

Light emitting diodes (LEDs) are an important class of solid-state devices that convert electric energy to light. Improvements in these devices have resulted in their use in light fixtures designed to replace conventional incandescent and fluorescent light sources. The LEDs have significantly longer lifetimes and, in some cases, significantly higher efficiency for converting electric energy to light.

The cost and conversion efficiency of LEDs are important factors in determining the rate at which this new technology will replace conventional light sources and be utilized in high power applications. Many high power applications require multiple LEDs to achieve the needed power levels, since individual LEDs are limited to a few watts. In addition, LEDs generate light in relatively narrow spectral bands. Hence, in applications requiring a light source of a particular color, the light from a number of LEDs with spectral emission in different optical bands is combined. Thus, the cost of many light sources based on LEDs is many times the cost of the individual LEDs.

The conversion efficiency of individual LEDs is an important factor in addressing the cost of high power LED light sources. The conversion efficiency of an LED is defined to be the electrical power dissipated per unit of light that is emitted by the LED. Electrical power that is not converted to light in the LED is converted to heat that raises the temperature of the LED. Heat dissipation places a limit on the power level at which an LED operates. In addition, the LEDs must be mounted on structures that provide heat dissipation, which, in turn, further increases the cost of the light sources. Hence, if the conversion efficiency of an LED can be increased, the maximum amount of light that can be provided by a single LED can also be increased, and hence, the number of LEDs needed for a given light source can be reduced. In addition, the cost of operation of the LED is also inversely proportional to the conversion efficiency. Hence, there has been a great deal of work directed to improving the conversion efficiency of LEDs.

For the purposes of this discussion, an LED can be viewed as having three layers, the active layer sandwiched between two other layers. These layers are typically deposited on a substrate such as sapphire. It should be noted that each of these layers typically includes a number of sub-layers. The overall conversion efficiency of an LED depends on the efficiency with which electricity is converted to light in the active layer and on the efficiency with which light generated in the active layer escapes from the LED.

Improvements in materials have led to improvements in the efficiency of light generated in the active layer. However, a significant fraction of the light generated in the active layer is lost before the light can escape from the LED. Most of this light is lost through absorption in the various layers used to construct the LED. This mode of light loss is aggravated by the trapping of much of the light within the LED structure.

The three-layer LED structure is typically bounded on the bottom and top by materials that have a significantly lower index of refraction than the layers of the LED. As a result, a significant fraction of the light striking these boundaries is reflected back into the layered structure. One of the boundaries includes a transparent surface through which the light generated in the LED escapes. The other boundary is typically covered by a reflector that redirects light striking that boundary toward the transparent boundary. As noted above, the transparent boundary is typically covered by a material having a much lower index of refraction than that of the LED structure. Light striking this boundary at angles greater than the critical angle with respect to the normal at the boundary is reflected back into the LED structure. The critical angle depends on the difference in the index of refraction between the LED layers and that of the surrounding medium, which is typically air or a material such as a plastic. For LEDs constructed from GaN or similar materials, the difference is sufficient to result in a significant fraction of the light being reflected. This reflected light becomes trapped between the planar boundaries of the LED where it will be continually reflected until the light is lost due to absorption. In the case of conventional GaN-based LEDs on sapphire substrates approximately 70 percent of the light emitted by the active layer remains trapped within the LED.

Several techniques have been described to improve light extraction from LEDs, and hence, improve the light conversion efficiency of these devices. In one class of techniques, one of the outer surfaces of the LED at which the light suffers internal reflection is converted from a smooth planar surface to a rough surface. Each time trapped light encounters this roughened surface as it transits the LED, some of the trapped light will be redirected such that, at the next reflection from the surface, the light will strike the surface at angles that are smaller than the critical angle of the exit surface. Hence, a portion of the trapped light will now escape, and the process can continue, extracting more light with each round trip through the LED.

Prior art LEDs based on roughening a surface to improve light extraction typically employ a rough surface either at the top surface of the LED or adjacent to the substrate on which the LED layers are deposited. These approaches improve the fraction of the light generated in the active layer that escapes the LED once that light escapes the active layer itself. However, a significant fraction of the light that is generated within the active layer is trapped within the active layer due to internal reflections at the boundaries between the active layer and the cladding layers on each side of the active layer. These reflections are caused by a difference in index of refraction between the materials from which the active layer is constructed and the materials from which the cladding layers are constructed. For GaN based LEDs, the active layer is constructed from materials that have a significantly higher index of refraction than the cladding layers.

SUMMARY OF THE INVENTION

The present invention includes a light emitting device and method for making the same. The light-emitting device includes an active layer disposed between first and second layers. The first layer has top and bottom surfaces. The top surface includes a first material of a first conductivity type, including a plurality of pits in the substantially planar surface. The active layer overlies the top surface of the first layer and conforms to the top surface, the active layer generating light characterized by a wavelength when holes and electrons recombine therein. The second layer includes a second material of a second conductivity type, the second layer overlying the active layer and conforming to the active layer. In one aspect of the invention, the pits have a dimension that is greater than the wavelength of light generated by the active layer. In another aspect of the invention, the device includes a substrate on which the first layer is constructed, the substrate having a lattice constant sufficiently different from that of the first material to give rise to dislocations in the first layer. At least some of the pits are located on such dislocations in yet another aspect of the invention.

DETAILED DESCRIPTION OF THE PREFERRED EMBODIMENTS OF THE INVENTION

Figure 1:
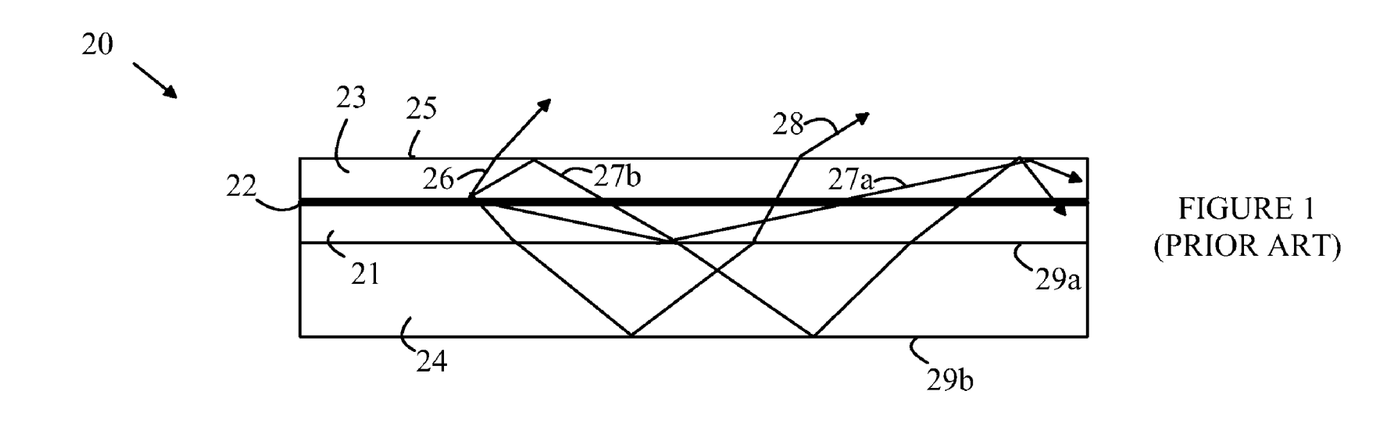
FIG. 1 is a simplified cross-sectional view of a prior art GaN-based LED.

The manner in which the present invention provides its advantages can be more easily understood with reference to FIG. 1, which is a simplified cross-sectional view of a prior art GaN-based LED. LED 20 is constructed by growing three layers on a sapphire substrate 24. The first layer 21 is an n-type GaN material. The second layer is a p-type GaN layer 23. The third layer 22 is an active layer that emits light when holes and electrons from layers 21 and 23 combine therein. As noted above, each of these layers may include a number of sub-layers. Since the functions of these sub-layers are well known in the art and are not central to the present discussion, the details of these sub-layers have been omitted from the drawings and the following discussion.

As noted above, light that is generated in layer 22 leaves layer 22 at all possible angles. Some of the light is emitted in a direction toward the top surface 25 of layer 23 and strikes surface 25 at angles that are less than the critical angle and escapes through surface 25 as shown at 26. Similarly, some of the light is directed toward substrate 24 and is reflected from either surface 29a or surface 29b before reflecting back to surface 25. If this light strikes surface 25 at angles less than the critical angle, this light also escapes through surface 25 as shown at 28. The remaining light strikes surface 25 at angles that are greater than the critical angle as shown at 27a and 27b and becomes trapped within the layers. The trapped light will either be absorbed during transit through the LED or will exit through the sides of the LED. In practice, most of the trapped light is absorbed, and hence, lost. As a result, the efficiency of LED 20 in converting electricity to light is poor.

Figure 2:
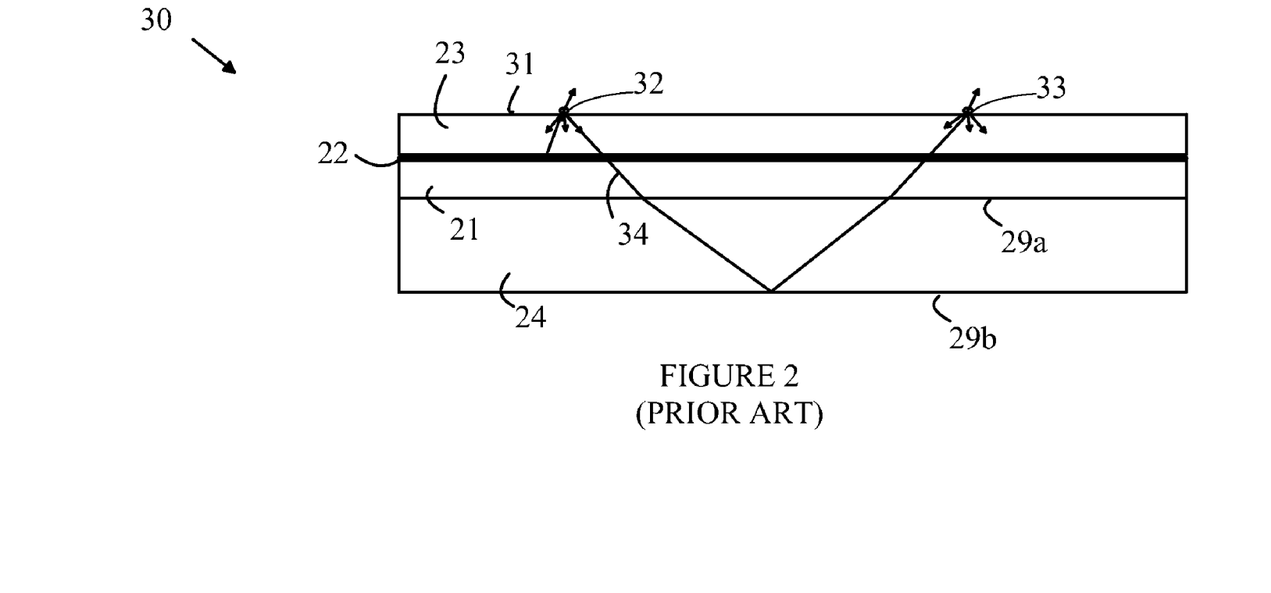
FIG. 2 is a simplified cross-sectional view of a prior art LED that utilizes a rough surface to improve the light extraction efficiency of the LED.

As noted above, one method that has been utilized to improve the extraction efficiency of the LED involves introducing scattering centers that prevent light from being trapped within the LED layers. For example, scattering centers can be provided on surface 25 that provide a random reorientation of the light that strikes the surface and is reflected back into the LED. Refer now to FIG. 2, which is a simplified cross-sectional view of a prior art LED that utilizes a rough surface to improve the light extraction efficiency of the LED. LED 30 is constructed by depositing layers 21-23 on substrate 24 in the same manner as LED 20 described above. The top surface 31 of layer 23 is modified to introduce scattering centers on the surface. Exemplary scattering centers are shown at 32 and 33; however, it is to be understood that surface 31 is covered with such scattering centers. When light leaving layer 22 strikes surface 31, part of the light will strike the surface at angles greater than the critical angle and escape. The remaining light will be scattered back into layer 23 at a number of different angles and will be reflected from boundaries 29a or 29b back toward surface 31. One such ray is shown at 34. When ray 34 strikes surface 31 at scattering center 33, the light will again be scattered with part of the light exiting through surface 31 and part being scattered back toward boundary 29a. Hence, at each reflection, part of the light that strikes surface 31 is extracted. Hence, a significant improvement in the light extraction efficiency can be obtained.

In such prior art devices, the scattering centers are located in the regions on either side of the active layer. For example, devices in which the scattering features are introduced at interface 29a or within the current spreading layer 21 have been proposed.

The present invention is based on the observation that in GaN based LEDs, the active region of the LED is constructed from materials that have a higher index of refraction than the n and p cladding layers that sandwich the active layer. As a result, light is trapped within the active layer by internal reflections at the active layer-cladding layer boundary. The amount of light that is trapped, and eventually absorbed, is a significant fraction of the light. Texturing of a portion of the LED outside of the active region cannot improve the extraction of such trapped light, since that light never interacts with the textured surface.

Figure 3:
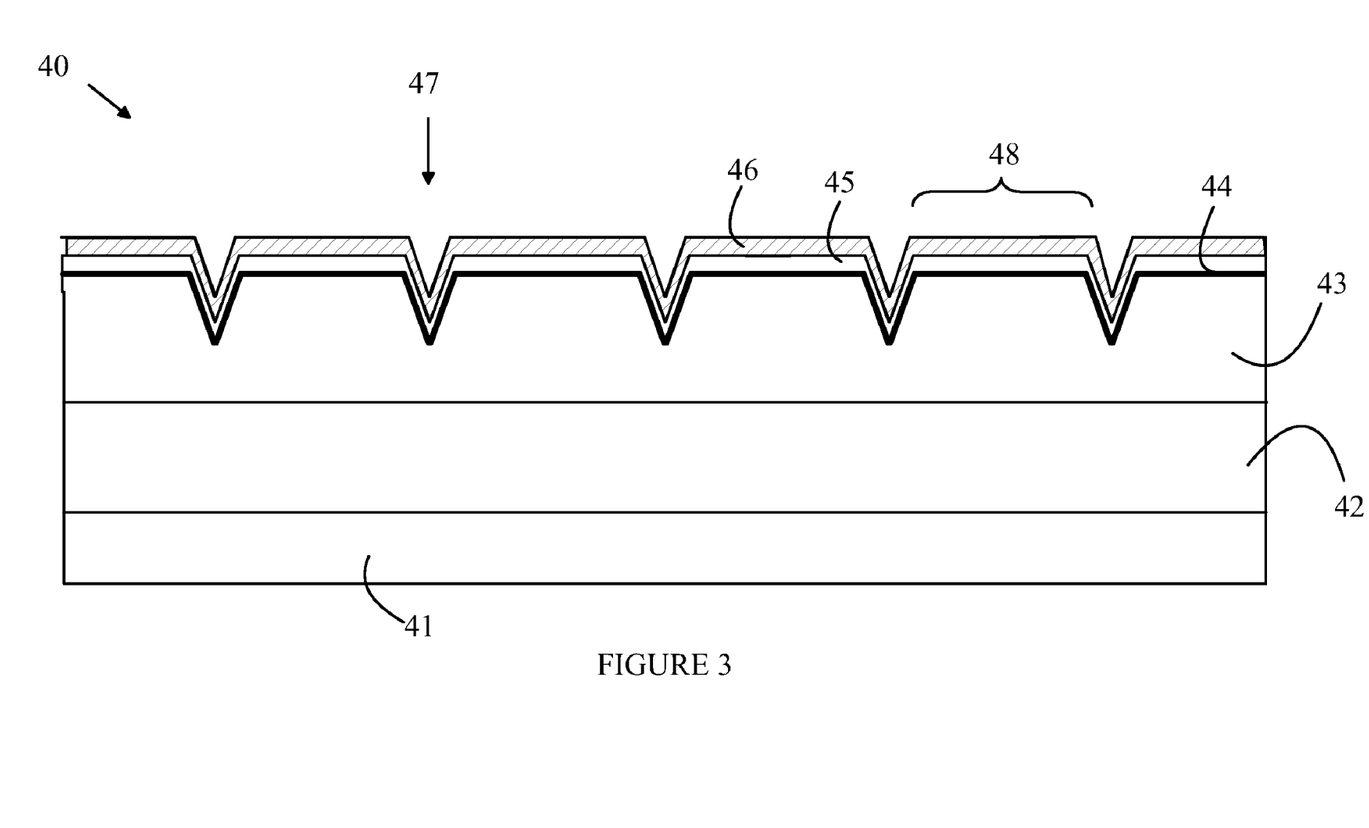
FIG. 3 is cross-sectional view of a portion of an LED according to one embodiment of the present invention.

Refer now to FIG. 3, which is cross-sectional view of a portion of an LED according to one embodiment of the present invention. LED 40 is constructed by depositing a number of n-type layers 42 on a substrate 41. The n-type layers end with an n-cladding layer 43. Cladding layer 43 includes a number of pits such as pit 47. The manner in which these pits are generated will be discussed in more detail below. After the pits have been formed, the active layer 44 and the p-cladding layer 45 are deposited. These layers follow the contours of the pits, and hence, both active layer 44 and p-cladding layer 45 include features that extract light trapped in either the active layer or the cladding layer.

An electrode 46 is then deposited over p-cladding layer 45 to provide one of the electrodes that will be used to power the LED. If light is to be extracted through the p-cladding layer, electrode 46 is constructed from a transparent material such as indium tin oxide. If the light is extracted through substrate 41, electrode 46 includes a reflecting layer to redirect light striking electrode 46 toward substrate 41.

LED 40 can be viewed as having a layered structure that includes planar sections that are interrupted by the angled sections formed in the pits. In one aspect of the invention, the layers above the active layer extend into the pits. Light that is trapped in the planar sections because that light strikes one of the planar sections at an angle greater than the critical angle will strike the regions in the pits at angles less than the critical angle, and hence, escapes through layer 46 in the case in which electrode 46 is transparent. In the case in which layer 46 is a reflector, the light is redirected toward substrate 41 at an angle that is less than the critical angle, and hence, escapes through the substrate. It should be noted that light trapped in the planar regions of the active layer is likewise re-directed, and hence, the present invention also improves the extraction of light from the active layer.

It should be noted that the planar sections do not require "roughening" to extract the light. This further improves the light output of the LED and the cost of making the LED. When roughening of the p-contact layer is used to provide improved light extraction, the scattering features interfere with the uniform spreading of current from the top electrode that is deposited over the roughened surface through the active layer. Hence, part of the benefit provided by the roughened surface is lost because of reduced light generation. In the case in which the top electrode is a mirror and light is extracted through substrate 41, the roughened p-contact layer leads to poor reflectivity in the mirror that is typically a layer of metal deposited over the p-contact layer. In addition, the steps needed to roughen the p-contact or p-cladding layer are eliminated which further reduces the cost of fabrication.

The above-described embodiments of the present invention require an n-cladding layer that is pitted and that acts as the substrate that is coated to provide the active layer and p-cladding layers. In one aspect of the present invention, the pitted substrate is created by making use of the dislocations in the n-GaN layers that result from the difference in the lattice constants between the GaN layers and the sapphire substrate on which the GaN layers are deposited.

Figure 4A:
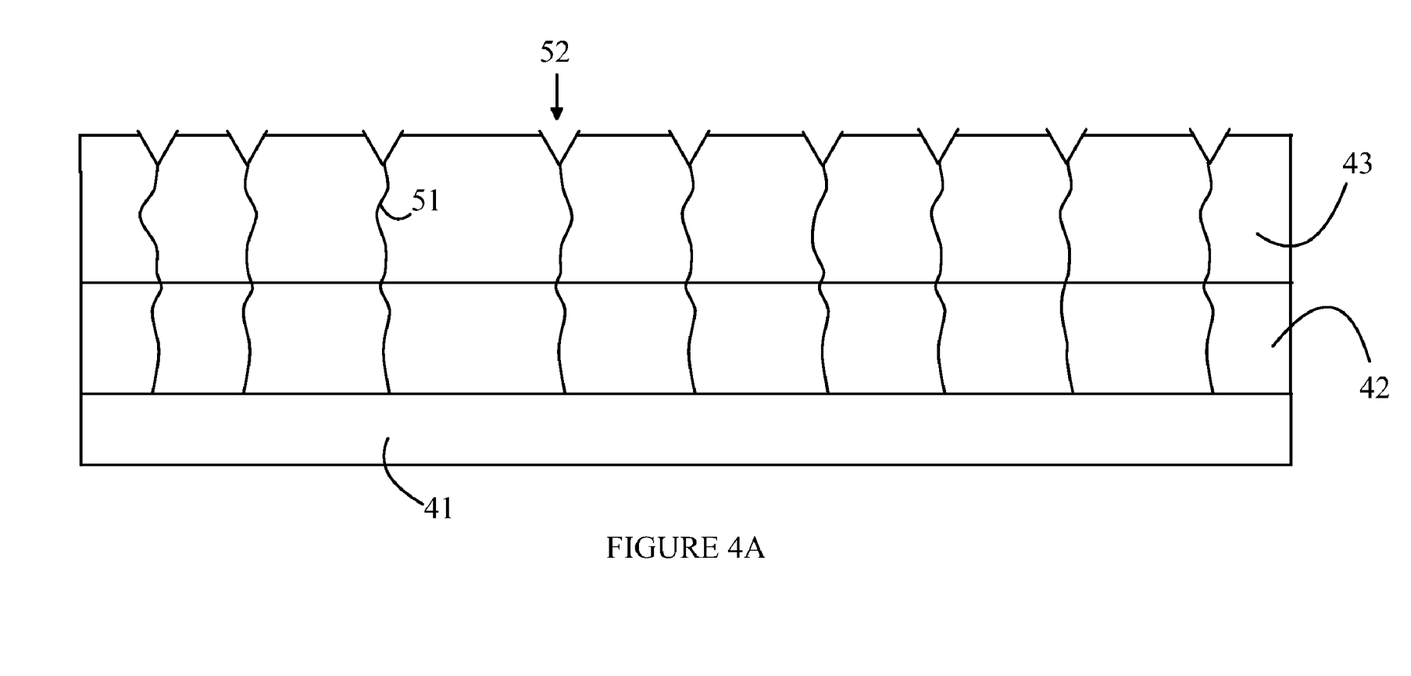
FIGS. 4A and 4B are cross-sectional views of a portion of the GaN layers through the n-cladding layer.

Refer now to FIG. 4A, which is a cross-sectional view of a portion of the GaN layers through the n-cladding layer discussed above. The GaN layers are deposited on a sapphire substrate 41 whose lattice constant differs from the GaN layers. The difference in lattice constant gives rise to dislocations that propagate through the various layers as the layers are deposited. An exemplary dislocation is labeled at 51. The density of such dislocation is typically $10^7$ to $10^{10}$ per cm$^2$ in a GaN LED deposited on a sapphire substrate. The present invention utilizes these dislocations to selectively form pits such as pit 52 into the surface of n-cladding layer 43.

Figure 4B:
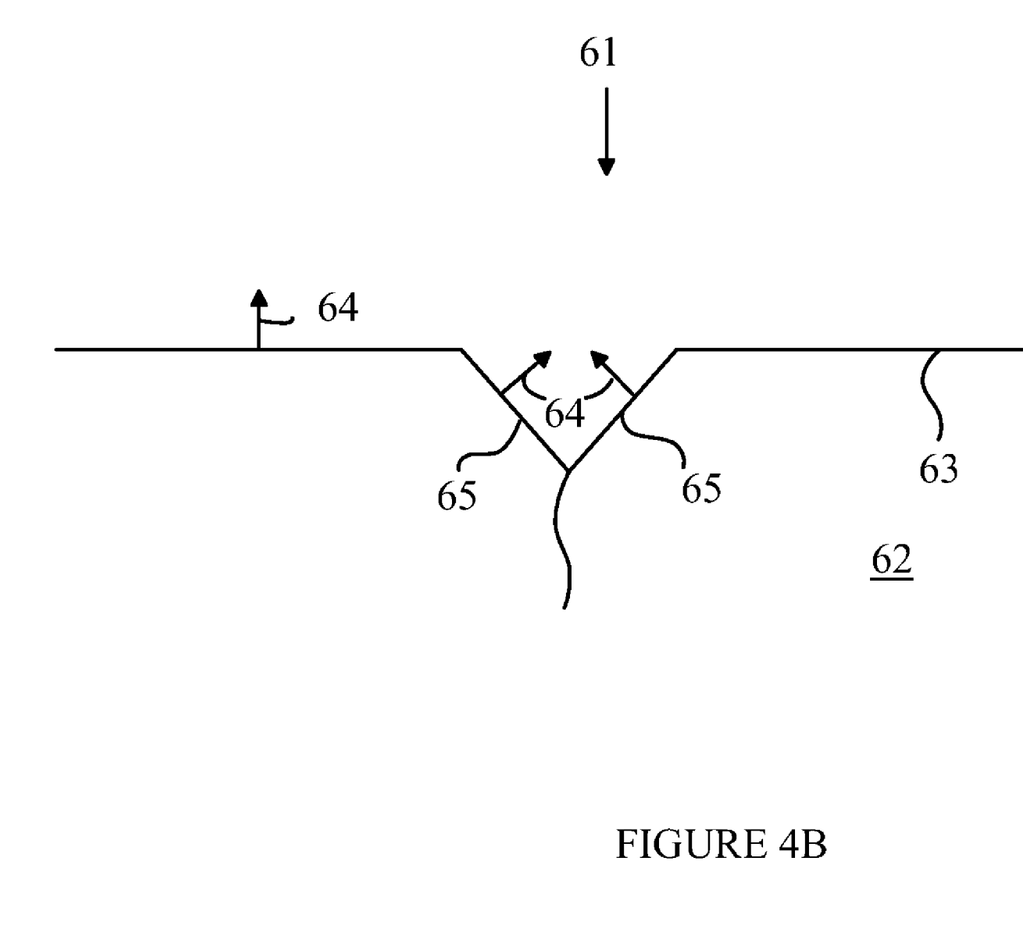

Refer now to FIG. 4B, which is an expanded cross-sectional view of a pit 61 in an n-cladding layer 62 during the growth of the n-cladding layer. During the growth phase, material is added to the crystal facets of layer 62 as shown by arrows 64. Pit 61 results in additional facets being exposed in addition to facet 63. The rate of growth on the different facets can be adjusted by the growth conditions such that the rate of growth of the facets 65 exposed in the pit is greater than or less than that of the rate of growth of the facet 63. By adjusting the rate of growth of facets 65 to be less than that of facet 63, the size of the pit can be increased without requiring a separate etching step or removing the substrate from the growth chamber.

In one embodiment, the planar surface of the LED layers corresponds to the c-plane of the GaN crystal. The growth conditions for the main layers of the LED (namely, the InGaN/GaN active region, the p-AlGaN electron blocking layer, and the pGaN contact layer) can be adjusted to suppress surface mobility such that the natural tendency of these materials to smooth the surface as the materials are deposited is suppressed. For example, in the InGaN/GaN active region, the GaN barrier layers can be grown using a combination of V/III ratio, growth rate, and growth temperature that minimizes the growth rate on the facet. This causes the pit to continue growing in diameter as the layer is grown, since the c-plane growth rate is much higher than the facet growth rate. Each of these three parameters has a strong effect on the surface mobility of the atoms on the growing surface, and hence, can be manipulated to cause the pit size to increase as the layer is grown. Similarly, these three parameters can likewise be optimized for the pAlGaN and pGaN layers in order for the pit to continue growing in size as these layers are deposited, as opposed to filling them in with material.

The pits can also be created by using an etchant that etches facets 65 at a rate greater than that of facet 63. For example, the etching operation can be accomplished in the same growth chamber by introducing $H_2$ into the growth chamber after the growth of the n-cladding layer is completed. The growth conditions can be set to enhance etching of the facets by utilizing a growth temperature that is greater than or equal to 950° C. using an ambient containing $NH_3$ and $H_2$. In the absence of any group III materials, this ambient will etch the facets at a much higher rate than the c-plane material. Over time, the pits will open up due to the difference in etch rate between the facets and the c-plane material.

The pits can also be etched chemically using a solution that preferentially etches the crystal facet relative to the c-plane face. For chemical etching, molten KOH can be used to etch the facets. Also, hot solutions of $H_2SO_4$:$H_3PO_4$ can be used to etch the material at temperatures greater than 250° C.

Referring to FIG. 3, once the pits have been etched in n-cladding layer 43, the active layer and p-cladding layers are deposited. The p-electrode 46 is then deposited over the p-cladding layer. In embodiments in which the light is extracted from the top surface of the LED, electrode 46 is a transparent electrode such as ITO. It should be noted that pits result in features in the active layer that redirect light that would normally be trapped in the active layer such that the otherwise trapped light is directed into the surrounding layers. Furthermore, the pits are randomly distributed, and hence, light that is trapped in the active layer or between the p-electrode 46 and any of the underlying layers is redirected to a location at which that light can then be "processed" by the layers over the pits and a portion of that light can then be recovered. Hence, the present invention provides both the conventional light recovery mechanism as well as allowing light that would otherwise be trapped in the active layer to escape.

The pits in the n-cladding layer preferably have dimensions that are of the order of the wavelength of light generated in the active layer or larger. This ensures that light is scattered or otherwise redirected at the pits. If pits are much smaller than the wavelength of light, the efficiency with which the light is scattered is significantly reduced. The pits also preferably have a depth sufficient to ensure that the top surface of the ITO layer extends into the pit so that light reflected at the interface between the ITO and the p-cladding layer escapes through the portion of surface of the ITO layer that is formed over the pit.

Figure 5:
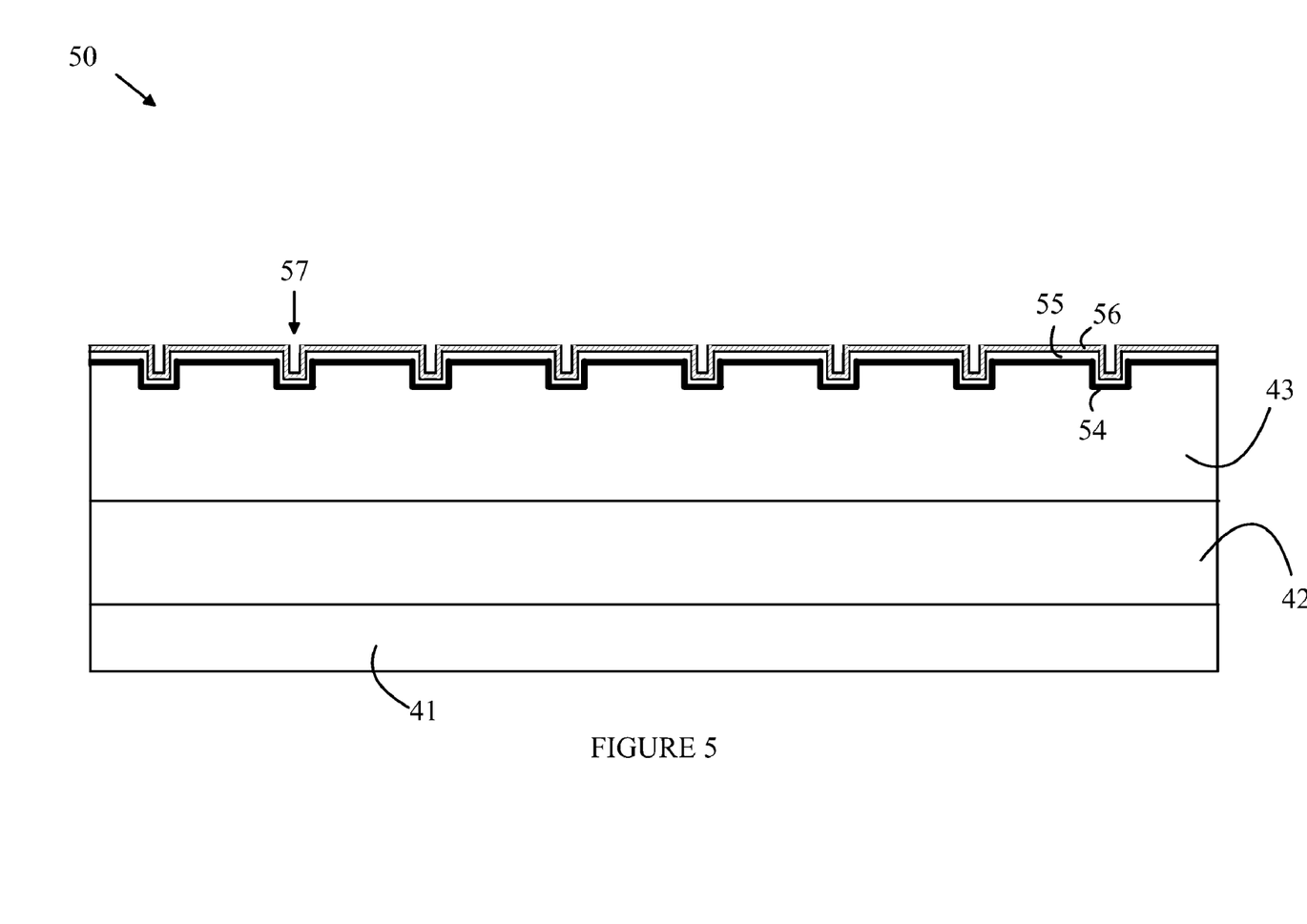
FIG. 5 is a cross-sectional view of another embodiment of an LED according to the present invention.

The above-described embodiments of the present invention utilize the dislocations in the n-cladding layer and underlying layers to guide the etching of the pits. However, embodiments in which the pits are created by conventional lithographic directed etching could also be constructed. Refer now to FIG. 5, which is a cross-sectional view of another embodiment of an LED according to the present invention. LED 50 utilizes "pits" 57 that are generated lithographically. In such embodiments, a lithographic map is generated on the n-cladding layer 43 after that layer has been deposited. The mask includes holes that expose the underlying n-cladding layer. The exposed material is then etched to provide the pits. After etching, the mask is removed and the wafer is returned to the growth chamber where the active layer 54, p-cladding layer 55 and top electrode 56 are deposited. Lithographically generated pits allow the pattern and density of the pits to be controlled more precisely; however, this advantage is provided at the cost of the additional masking steps.

Refer again to FIG. 3. The surface of LED 40 can be viewed as having planar regions 48 that are interrupted by pits. Light that strikes these planar regions at angles less than the critical angle will be reflected back into the LED toward substrate 41. This light will be reflected back toward the surface of LED 40 at one of the boundary layers within the LED. The non-pitted areas 48 between the pits are preferably sufficiently small to ensure that light that is reflected from a planar surface in the non-pitted areas will not return on a subsequent reflection from one of the other planar surfaces to that same non-pitted region. That is, this reflected light should not be trapped within a non-pitted area for a number of reflections without encountering one of the pits. The minimum density of pits required to satisfy this condition depends on the thickness of the LED. The thicker the LED, the lower the required density of the pits.

The amount of light that is trapped in the LED also depends on the density of pits in the LED. As the density of pits increases, the efficiency of light extraction also increases; however, the improvement obtained by increasing the density of pits decreases once the density of pits reaches some predetermined level. As the density of pits is increased, the amount of absorbing material through which the light must travel before being extracted from the LED decreases. Once the absorption becomes small compared to the amount of light that escapes the LED, further improvements are less valuable. In addition, the pits can reduce light output because the active layer in the pitted regions may not generate light with the same efficiency as the portions of the active layer that underlie the planar regions. Accordingly, the density of pits is preferably set such that the amount of light that is absorbed within the LED structure is less than some predetermined value. In practice, a pit density in the range of $10^7$ to $10^{10}$ pits per $cm^2$ is sufficient.

The density of pits in LEDs that utilize dislocations in the LED layers can be controlled by choosing the substrate on which the layers are deposited and by varying the growth conditions during the deposition of the n-type layers and any buffer layers on which these layers are deposited. The density of dislocations can be increased by choosing a substrate having a greater mismatch lattice constant with that of the n-type layers and/or by adjusting the growth conditions of the buffer layers that are deposited on the substrate prior to depositing the n-cladding layer. In addition to the sapphire substrates discussed above, SiC, AlN, and Silicon substrates could be utilized to provide different degrees of mismatch.

Typically, one or more layers of material are deposited on the substrate under conditions that reduce the number of dislocations that propagate into the n-cladding layer. Additionally, altering the growth conditions of the layer deposited on the buffer layer also alters the density of dislocations. Growth parameters like V/III ratio, temperature, and growth rate all have significant effects on the dislocation density if they are changed in the early layers of the structure. Normally, these parameters are chosen to reduce the density of dislocations; however, the present invention can utilize these parameters to increase the level of dislocations.

The optimum density will, in general, also depend on the thickness of the LED layers. Light that is reflected from the top surface of the LED at an angle that is greater than the critical angle and misses a pit will, in general, pass through the active layer and be reflected from one of the layer boundaries under the active layer. This light will then return to the top surface and be reflected again. Hence, the path length depends on the thickness of the LED layers as well as the density of pits.

The above-described embodiments of the present invention utilize layers that overlie another layer. For the purpose of this application, it is to be understood that a first layer that overlies a second layer may or may not be in direct contact with the second layer. Similarly, the above-described embodiments utilize layers of transparent material. For the purposes of this application, a layer will be defined as being transparent if the layer transmits light of the wavelength generated in the active layer with a transmittance of greater than 90 percent. A mirror layer is defined to be a layer that reflects light of the wavelength generated by the active layer with a reflectance of greater than 90 percent.

The above-described embodiments utilize the GaN family of materials. For the purposes of this discussion, the GaN family of materials is defined to be all alloy compositions of GaN, InN and AlN. However, embodiments that utilize other material systems and substrates can also be constructed according to the teachings of the present invention. The present invention is particularly well suited to GaN based LEDs on sapphire substrates because the GaN family of materials exhibits particularly high indices of refraction, and hence, the problems associated with light trapping are particularly severe in this type of LED.

The above-described embodiments of the present invention refer to "pits" in the n-cladding layer. For the purposes of this discussion, a pit is defined to be a cavity in a surface. The pits must have a depth that is greater than that of the first sub-layer of the active layer to provide current to at least one of the underlying sub-layers. In the above-described embodiments, the pits extend through the stack of sub-layers; however, pits of intermediate depths will still provide improvements.

The present invention has been described in terms of embodiments in which the n-type cladding layer is deposited first on the substrate. Such embodiments are currently preferred because of technical problems associated with the deposition of a p-cladding layer on the substrate followed by the deposition of an active layer and n-cladding layer. However, it is to be understood that the present invention could be used to generate LEDs in which the p-cladding layer is deposited first if these technical problems are not determinative for the particular application.

The above-described embodiments are described in terms of "top" and "bottom" surfaces of the various layers. In general, the layers are grown from the bottom surface to the top surface to simplify the discussion. However, it is to be understood that these are merely convenient labels and are not to be taken as requiring any particular orientation with respect to the Earth.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent to those skilled in the art from the foregoing description and accompanying drawings. Accordingly, the present invention is to be limited solely by the scope of the following claims.

What is claimed is:

1. A device comprising:
a first layer having top and bottom surfaces, said top surface comprising a first material of a first conductivity type and including a plurality of pits in a substantially planar surface, said top and bottom surfaces being characterized by a distance between said top and bottom surfaces, said distance being less in said pits than in said areas outside said pits;
an active layer overlying said top surface of said first layer, said active layer generating light characterized by a wavelength when holes and electrons recombine therein;
a second layer comprising a second material of a second conductivity type, said second layer comprising a cladding layer having a top surface and a bottom surface, said bottom surface overlying said active layer and conforming to said active layer, said top surface having depressions therein that extend into said pits; and a substrate on which said first layer is constructed, said substrate having a lattice constant sufficiently different from that of said first material to give rise to dislocations in said first layer, said pits being characterized by a bottom point that is closest to said substrate, said pits being located such that said bottom point of each of said pits lies on a different one of said dislocations.

2. The device of claim 1 wherein said pits have a dimension that is greater than said wavelength of light generated by said active layer.

3. The device of claim 1 further comprising a layer of electrically conducting material having a top surface and a bottom surface, said top surface of said layer of electrically conducting material overlying said top surface of said second layer and conforming to said top surface of said second layer.

4. The device of claim 3 wherein said layer of electrically conducting material is transparent to said light generated in said active layer.

5. The device of claim 4 wherein said top surface of said layer of electrically conducting material extends into said pits.

6. The device of claim 1 wherein said substrate is chosen from the group consisting of sapphire, SiC, silicon, AlN, and said first material comprises a material from the GaN family of materials.

7. The device of claim 1 wherein said dislocations are present at a density greater than $10^7$ dislocations per $cm^2$.

8. The device of claim 3 wherein said top surface of said electrically conducting material is substantially planar between said pits.

* * * * *